United States Patent [19]

Shirasaka

[11] 4,287,594
[45] Sep. 1, 1981

[54] FUNCTION TEST EVALUATION APPARATUS FOR EVALUATING A FUNCTION TEST OF A LOGICAL CIRCUIT

[75] Inventor: Hisatoshi Shirasaka, Tokyo, Japan

[73] Assignee: Tokyo Shibaura Denki Kabushiki Kaisha, Japan

[21] Appl. No.: 102,835

[22] Filed: Dec. 12, 1979

[30] Foreign Application Priority Data

Dec. 23, 1978 [JP] Japan ............................... 53-160709

[51] Int. Cl.³ ...................... G01R 31/28; G06F 11/00
[52] U.S. Cl. ................................... 371/25; 324/73 R;
                                                371/20; 371/27
[58] Field of Search .......................... 371/20, 25, 27;
                                      324/73 R, 73 PC, 73 AT

[56] References Cited

U.S. PATENT DOCUMENTS

| | | | |
|---|---|---|---|
| 3,651,315 | 3/1972 | Collins | 324/73 R |
| 3,961,250 | 6/1976 | Snethen | 371/25 |
| 3,976,940 | 8/1976 | Chau et al. | 324/73 R |
| 4,168,527 | 9/1976 | Winkler | 324/73 R |
| 4,192,451 | 3/1980 | Swerling et al. | 371/20 |
| 4,194,113 | 3/1980 | Fulks et al. | 371/20 |

Primary Examiner—Charles E. Atkinson
Attorney, Agent, or Firm—Finnegan, Henderson, Farabow, Garrett & Dunner

[57] ABSTRACT

Input test information and the expected value information stored in a main memory are stored in first and second local memories through first and second write circuits. The first and second local memories are addressed with given different phases by address control circuits, respectively, so that the first and second local memories produce the information in parallel fashion within given periods. The information outputted are temporarily stored into a data register which in turn applies it to the data multiplexer. Upon the application of the information, the data multiplexer converts the information inputted parallel thereto into serial information which in turn is applied to the input pattern format control circuit and a GO/NO GO judgment circuit. The response information from the integrated circuit to be tested is applied to the GO/NO GO judgment circuit where GO or NO GO of the integrated circuit is judged.

1 Claim, 11 Drawing Figures

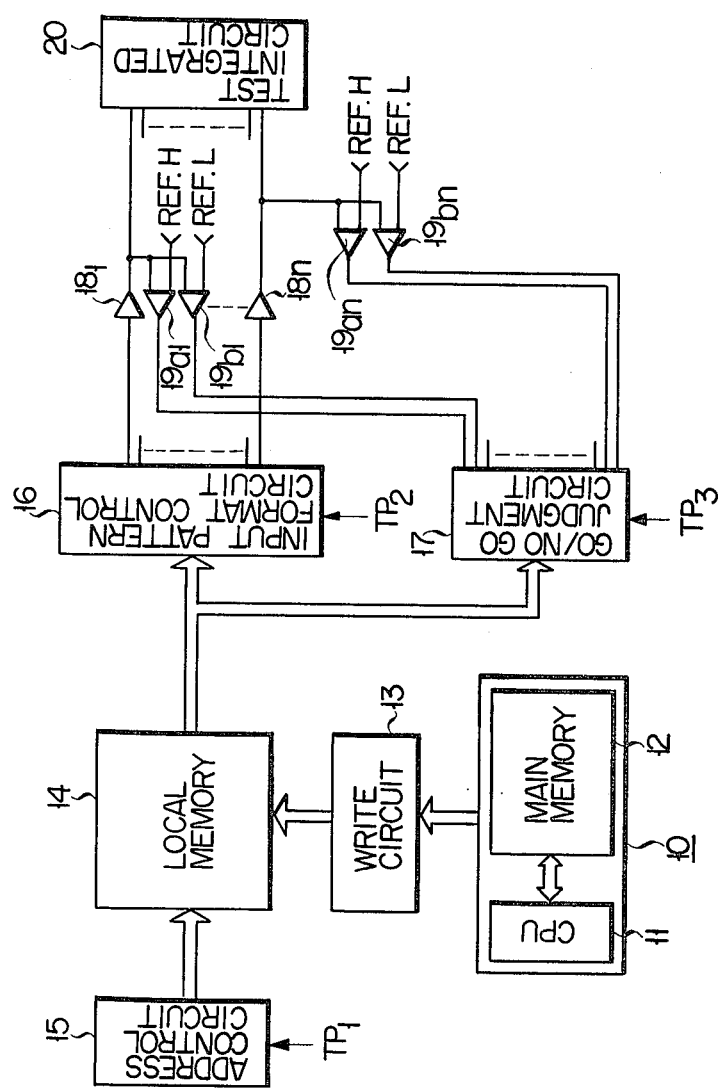
F I G. 1

F I G. 5
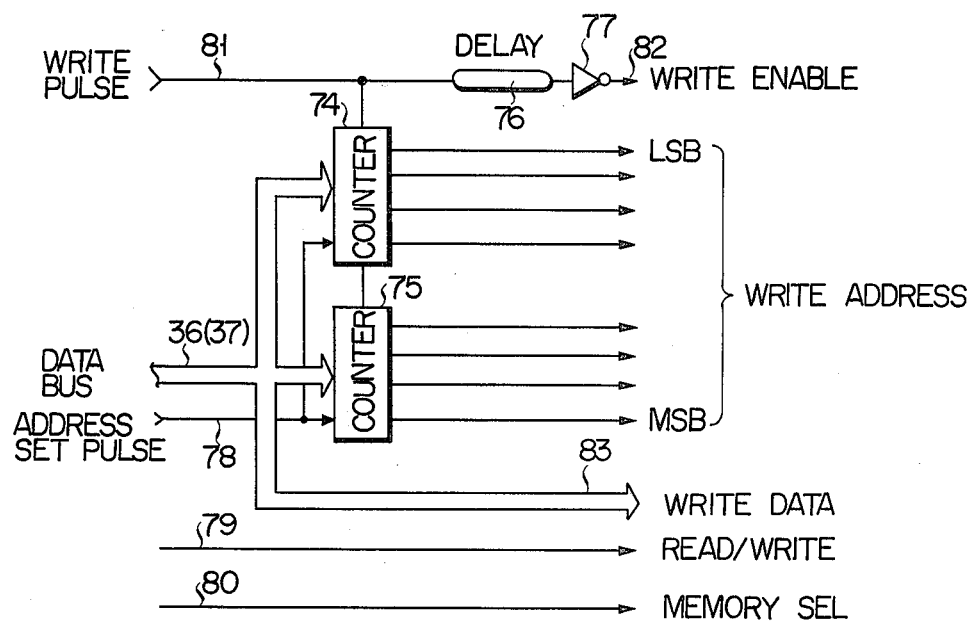
F I G. 6
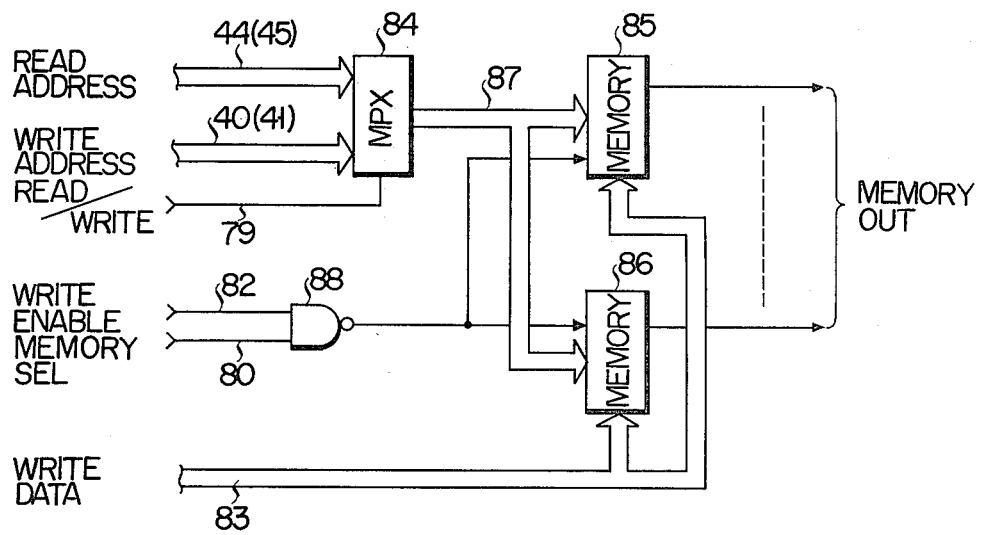

| IN/OUT | 1 1 0 0 | | | 1 1 0 0 |
|---|---|---|---|---|
| PIN NO.<br>ADDRESS | 1 2 3 4 | | | n ~92 |
| 0 | 0 1 1 — — — — | | | |
| 0' | 0 0 0 — — — — | | | |
| 1 | 1 1 0 — — — — | | | |
| 1' | ⋮ ⋮ ⋮ | | | |
| 2 | ⋮ ⋮ ⋮ | | | |
| 2' | ⋮ ⋮ ⋮ | | | |
| ⋮ | | | | |
| N | | | | |

FIG. 9
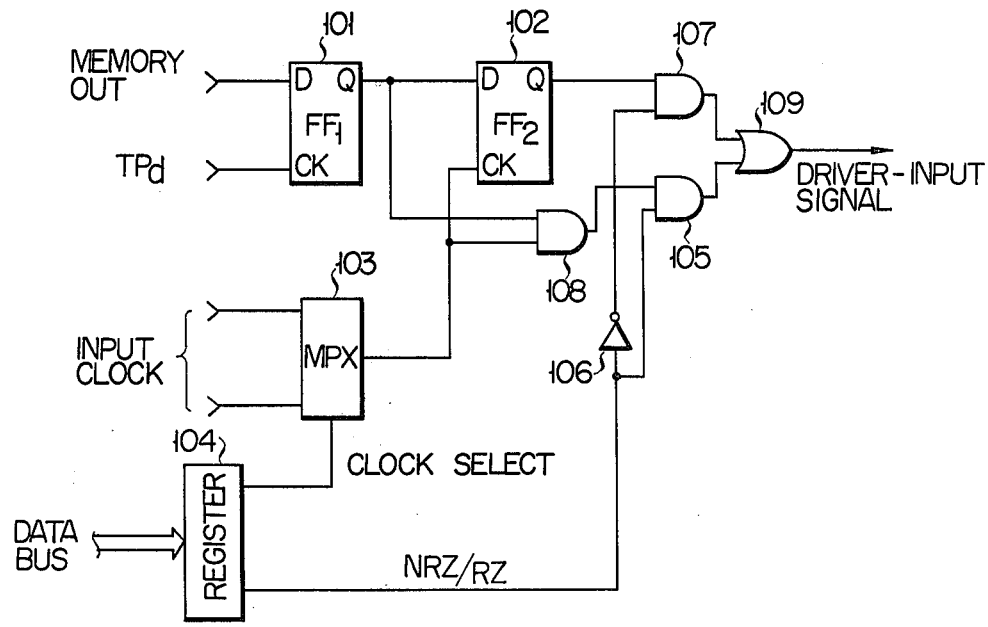
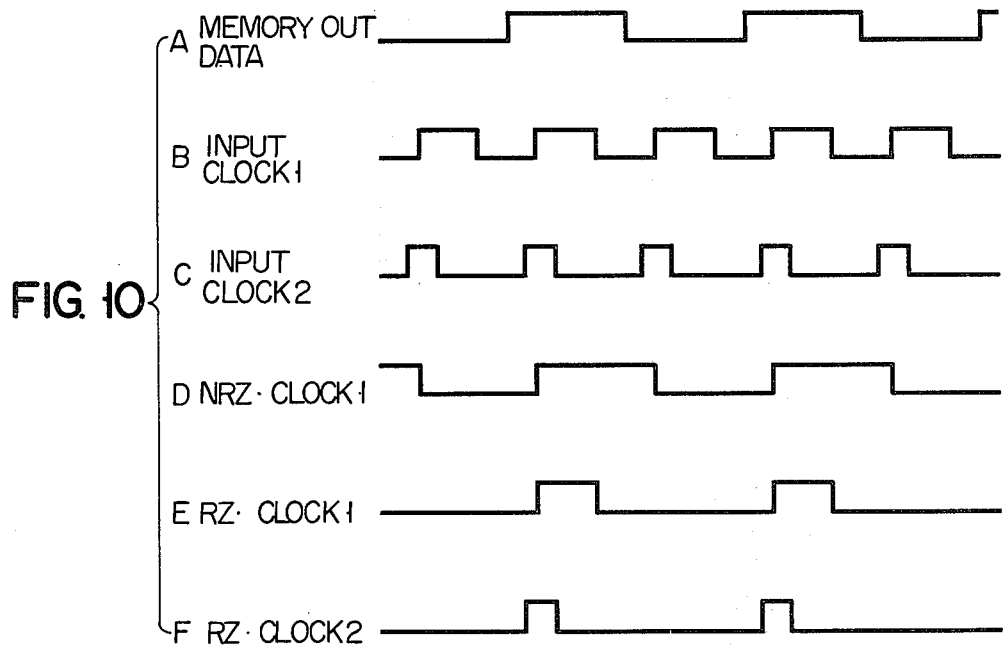

FUNCTION TEST EVALUATION APPARATUS FOR EVALUATING A FUNCTION TEST OF A LOGICAL CIRCUIT

BACKGROUND OF THE INVENTION

The invention relates to a function test evaluation apparatus for evaluating a function test of an integrated circuit in a manner that the test information is supplied to an integrated circuit to be tested and the output information outputted from the integrated circuit is compared with the expected information previously prepared.

A function test evaluation apparatus for judging if a large scale integrated circuit (LSI) such as a one-chip microcomputer is operating properly generally needs a memory (hereinafter called a local memory) for storing the expected value information and the input test information to be supplied to an integrated circuit to be tested.

FIG. 1 shows a block diagram of a conventional function test evaluation apparatus for evaluating a function test of an integrated circuit. In the figure, a control section 10 is comprised of a central processor (CPU) and a main memory 12. The main memory 12 stores the input test information for testing the function of the integrated circuit and the expected information for evaluating the response information from the integrated circuit under test. A write circuit 13 successively writes the information read out from the main memory 12 into a local memory 14.

The input test information and the expected value information having been written into the main memory 12 by the write circuit are stored in the local memory 14. The data stored in the local memory 14 is successively read out under control of an address control circuit 15 when the test is conducted. The input test information and the expected value information are supplied to an input pattern format control circuit 16 and a GO/NO GO judgment circuit 17.

In the input pattern format control circuit 16, the input test information is selected and, in the GO/NO GO judgment circuit 17, the expected value information is selected. The input test information inputted to the input pattern format control circuit 16 are time-shaped therein, are converted into necessary voltage levels by a plurality of data drivers $18_1$ to $18_n$, and are finally applied into an integrated circuit 20 to be tested. Responding to the test information, the integrated circuit 20 produces the response information which in turn are applied in parallel to a set of voltage comparators $19_{a1}$ to $19_{an}$ and $19_{b1}$ to $19_{bn}$.

A reference voltage with a logical high level is further inputted to the voltage comparators $19_{a1}$ to $19_{an}$ while a reference voltage with a logical low level is further applied to the voltage comparators $19_{b1}$ to $19_{bn}$. The voltage comparators $19_{a1}$ to $19_{an}$ and $19_{b1}$ to $19_{bn}$ are used to set the voltage level of information produced from the integrated circuit 20 to a HIGH level (logical '1') or a LOW level (logical '0'). The information after its level is set is then applied to the GO/NO GO judgment circuit 17. The judgment circuit 17 compares the information supplied through the voltage comparators $19_{a1}$ to $19_{an}$ and $19_{b1}$ to $19_{bn}$ with the expected value information and evaluates the function of the integrated circuit 20 on the basis of the result of the comparison.

The operation of the function test evaluation apparatus described above will be described by using the timing charts shown in FIG. 2. First, a timing pulse $TP_1$ as shown in FIG. 2A is supplied to the address control circuit 15. Since the control circuit 15 operates in synchronism with the timing pulse $TP_1$, the different address information are successively inputted to the local memory 14 every period $T_1$ of the timing pulse $TP_1$. After a period $T_2$ shown in FIG. 2 since the local memory 14 is addressed by the address information, the read-out operation of the information previously stored in the local memory 14 is completed. Following the read-out operation, the input pattern format control circuit 16 time-shapes the information read out in synchronism with the input timing pulse $TP_2$ shown in FIG. 2C. Then, the information is supplied through the data drivers $18_1 \ldots 18_n$ to the integrated circuit 20. The information outputted from the integrated circuit 20 is inputted to the GO/NO GO judgment circuit 17 where it is compared in synchronism with the timing $TP_3$ with the expected value information. Since the information is read out from the local memory 14 every period $T_1$ of the timing pulse $TP_1$, the period $T_1$ is the test period.

In order to evaluate the function of a LSI circuit, a great number of input test information and expected value information are necessary. Therefore, for processing the information for its evaluation within a short time, it is necessary to operate the memory at a high speed and to read out the information for a short time. Further, in order to perform the function evaluation in real time, the local memory 14 must be operated at a speed almost equal to that of the integrated circuit 20. The operation of the local memory 14 at a high speed may be realized by shortening the test period $T_1$. However, it is impossible to make the period $T_1$ shorter than the cycle time $T_2$ of the local memory 14. As a consequence, in order to operate the local memory 14 at high speed, it is necessary to use a local memory with a short cycle time. However, such a local memory with a short cycle time is expensive, so that the function test evaluation apparatus is also expensive.

SUMMARY OF THE INVENTION

Accordingly, an object of the invention is to provide a function test evaluation apparatus for evaluating the function of an integrated circuit for within short time.

In order to achieve the above object, there is provided a function test evaluation apparatus for evaluating the function of a logic circuit comprising: a control section including a main memory for storing the input test information to be supplied to an integrated circuit to be tested and the expected value information to be outputted from the integrated circuit, and a central processing element for performing various controls; a plurality of memory means which store the input test information supplied from the main memory of the control section and the expected value information, such information being read out by addressing; a plurality of write circuit means for writing the input test information outputted from the main memory and the expected value information therefrom; an address control circuit means for simultaneously supplying the same address information to the memory means; a plurality of data register means which temporarily store the information read out from the memory means when those are addressed by the address control circuit; parallel-to-serial converting means which is supplied in a parallel fashion with the information read out from the data register means and to produce the information in a parallel fashion; pattern format control circuit means which time-shapes the test information outputted serially from the parallel to serial converting circuit means and supplies it to the circuit to be tested; and a judgment circuit for comparing the expected value information outputted serially from the parallel-to-serial converting circuit with the information outputted from the integrated circuit after it is supplied with the input test information.

This invention will be better understood from the following description taken in connection with the accompanying drawings, in which:

BRIEF DESCRIPTION OF THE DRAWINGS

FIG. 1 shows a block diagram of a conventional function test evaluation apparatus for evaluating the function of a logic circuit;

FIG. 5 shows a circuit diagram of a write circuit used in the circuit shown in FIG. 3;

FIG. 6 shows a circuit diagram of a local memory used in the circuit shown in FIG. 3;

FIG. 9 shows a circuit diagram of an input pattern format control circuit used in the same circuit;

FIG. 10 shows a set of waveforms of the output signals outputted from the input pattern format control circuit shown in FIG. 9.

Figure 2:
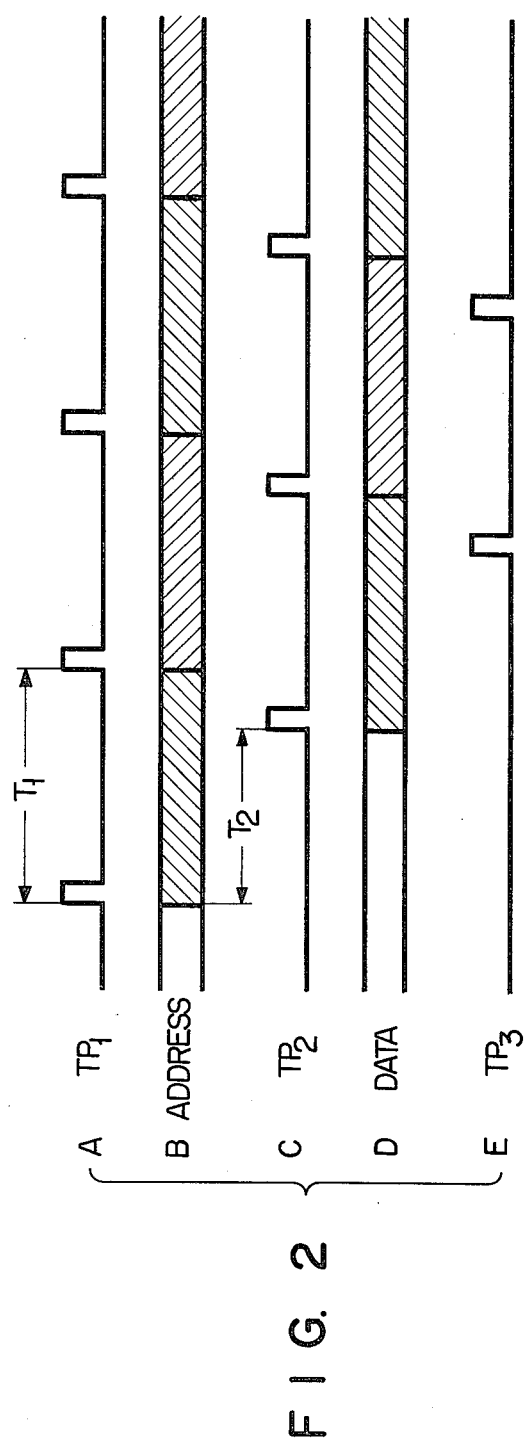
FIG. 2 shows a set of timing charts useful in explaining the operation of the apparatus shown in FIG. 1.
Figure 3:
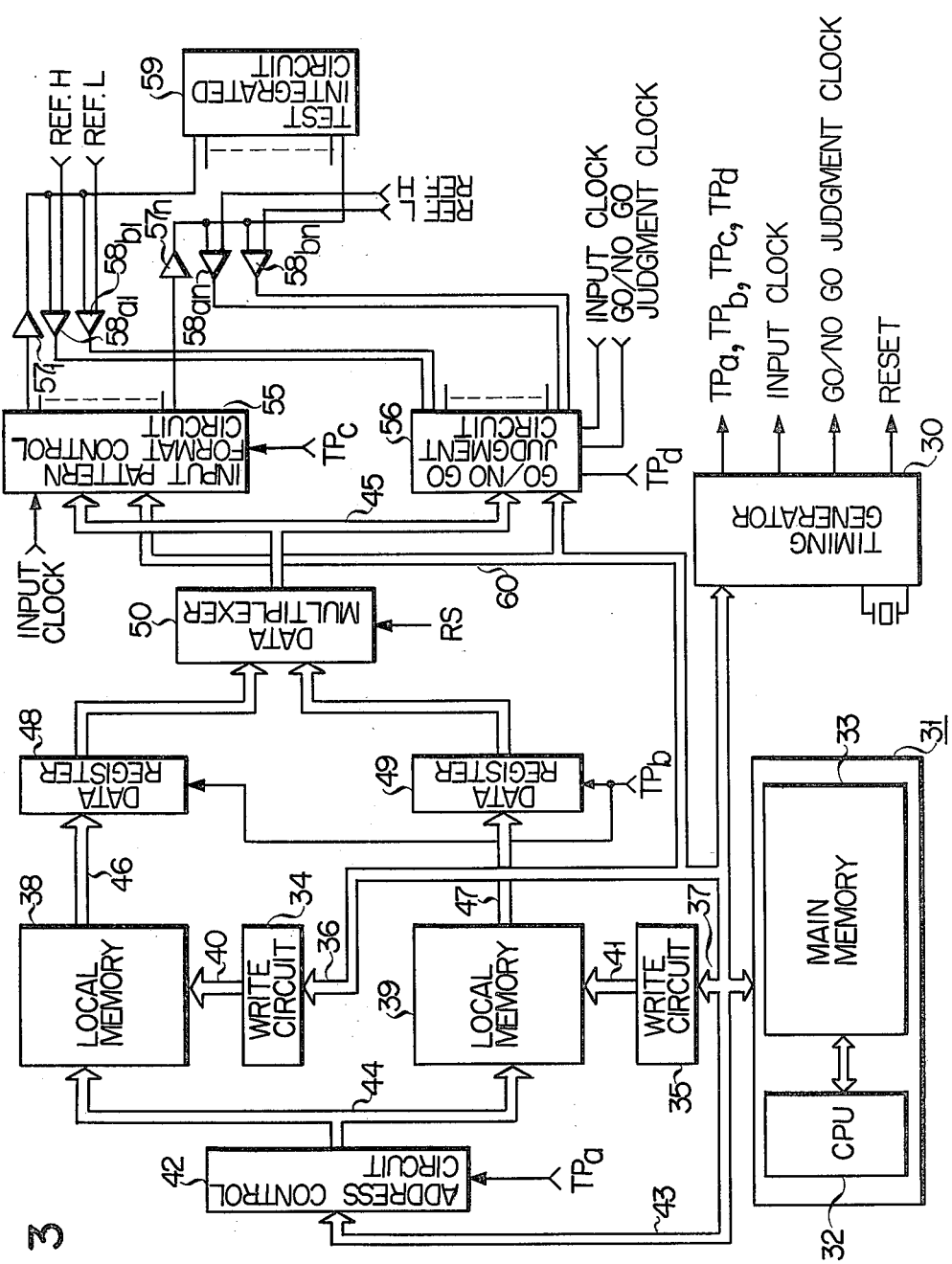
FIG. 3 shows a block diagram of an embodiment of the function test evaluation apparatus according to the invention.

DETAILED DESCRIPTION OF THE PREFERRED EMBODIMENT FUNCTION TEST EVALUATION APPARATUS (FIG. 3)

FIG. 3 is a block diagram illustrating an embodiment of a function test evaluation apparatus for testing the function of a logical circuit according to the invention. In the figure, a control section 31 is comprised of a CPU 32 and a main memory 33. As in the conventional apparatus, in the main memory 33 are previously stored the input test information and the expected value informaton which are required for evaluating the function test of the logical circuit. The control section 31 is connected through data buses 36 and 37 to first and second write circuits 34 and 35. Further, the first and second write circuits 34 and 35 are connected through data buses 40 and 41 to first and second local memories 38 and 39. The write circuits 34, 35 write into the first local memory 38 and the second local memory 39 the input test information and the expected value information read out from the main memory 33. An address control circuit 42 is connected through an address bus 43 to the control section 31 and is further connected through a data bus 44 to the first and second local memories 38 and 39. The address control circuit 42 also produces address information A in sequence every time a timing pulse $TP_a$ is inputted thereto.

The first and second memories 38 and 39 are connected through data buses 46 and 47 to first and second data registers 48 and 49, respectively. The data registers 48 and 49 store the information outputted from the first and second local memories 38 and 39 when receiving a timing pulse $TP_b$, and hold the information stored until the data registers 48, 49 receive the next timing pulse. The first and second data registers 48 and 49 are connected to a data multiplexer 50 to supply the data outputted by the registers 48, 49 to the multiplexer 50 in parallel.

A read select signal RS is inputted to the data multiplexer 50 to select the output information from the first and second local memories 38 and 39 on the basis of the logical value of the signal RS. Specifically, the data multiplexer 50 selects information outputted from the first local memory 38 during the period that the RS signal is a high level and selects the information outputted from the second local memory 39 during the period that the RS signal is a low level. To be more specific, the data multiplexer 50 has a parallel-to-serial converting function for converting two pieces of information inputted in parallel into serial output information.

An output from the data multiplexer 50 is transferred by data bus 45 to an input pattern format control circuit 55 and a GO/NO GO judgment circuit 56. The circuits 55 and 56 are connected to the control section 31 through a data bus 60.

The input pattern format control circuit 55 receives the input test information and the expected value information from the data multiplexer 50. The circuit 50 selects the input test information received from The input pattern format control circuit 55 also receives an input clock and the a signal for designating a return-to-zero (RZ) of a non-return-to-zero (NRZ) from the control 31 through a data bus 60. The time-shaped information are inputted to a plurality of data drivers $57_1$ to $57_n$. The data drivers $57_1$ to $57_n$ convert the voltage level of the information inputted thereto into a given voltage level. The information converted to have a given voltage level is inputted to an integrated circuit 59 to be tested.

After receiving the test information, the integrated circuit 59 produces the response information which in turn is inputted in parallel to pairs of voltage comparators $58_{a1}$ and $58_{b1}$ to $58_{an}$ to $59_{bn}$. The voltage comparators $58_{a1}$ and $58_{b1}$ to $58_{an}$ and $58_{bn}$ set the voltage level of the information produced from the test integrated circuit 59 to a logical "HIGH" level or a logical "LOW" level.

The information, after the voltage level thereof is set, is applied to the judgment circuit 56. The judgment circuit 56 synchronizes a response information and the expected value information applied thereto through the voltage comparators $58_{a1}$ and $58_{b1}$ to $58_{an}$ and $58_{bn}$ with a timing pulse $TP_d$ and compares them. Depending upon the result of the comparison, the circuit 56 judges if the test integrated circuit 59 is functioning properly. The control section 31, which is coupled with a timing generator 30 through a data bus, controls the timing generator 30 to produce timing pulses $TP_a$ to $TP_d$, a reset signal RS to be applied to the data multiplexer 50, an input clock signal, a clock signal for judgment of the circuit function and the like. The timing pulses $TP_a$ to $TP_d$ are respectively applied to the address control circuit 42, the data registers 48 and 49, the input pattern format control circuit 55 and the judgment circuit 56.

ADDRESS CONTROL CIRCUIT (FIG. 4)

Figure 4:
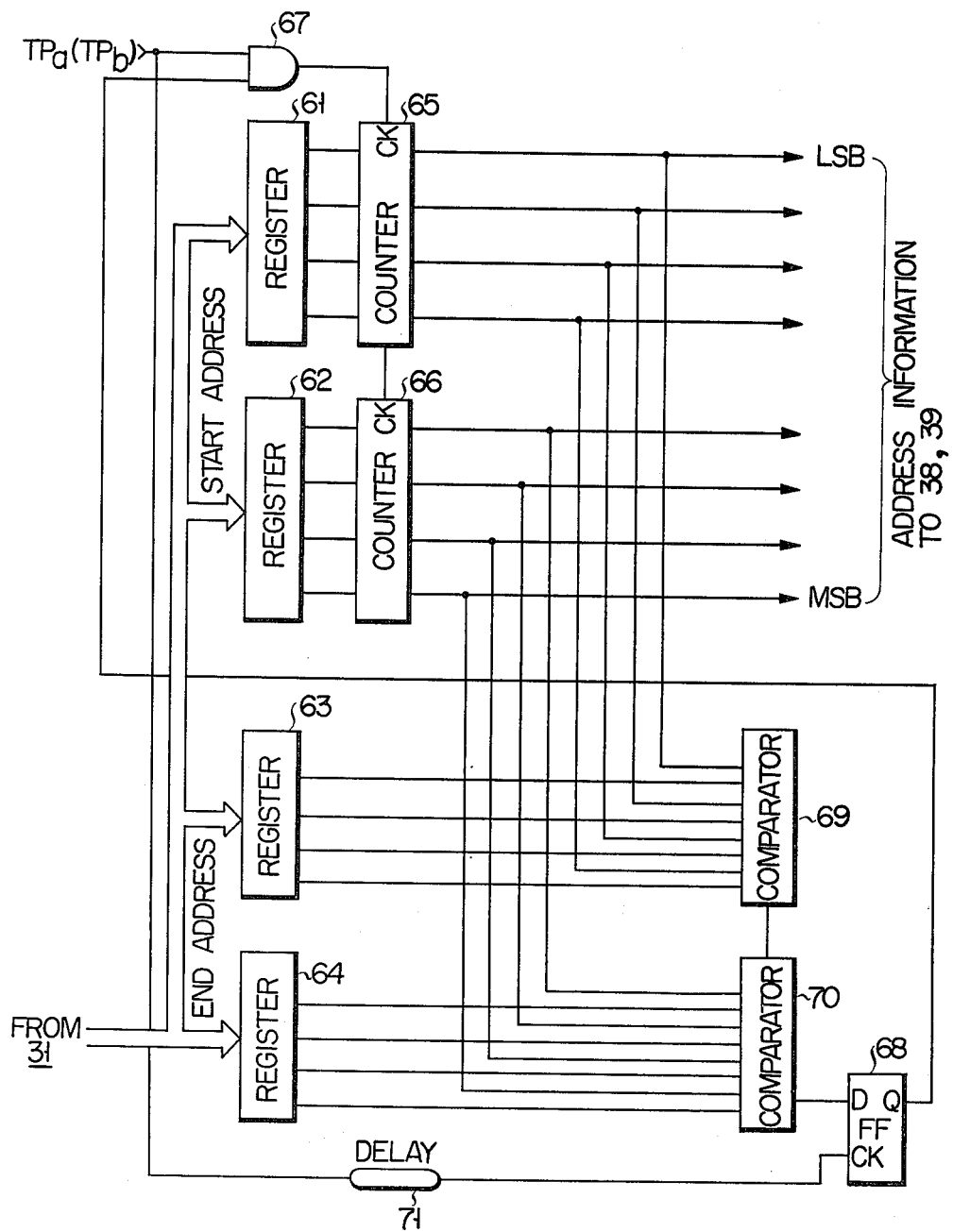
FIG. 4 shows a circuit diagram of an address control circuit used in the circuit shown in FIG. 3.

The address control circuit 42 (43) will be described in detail with reference to FIG. 4. Those circuits are the same in construction and hence only one of them will be described. The address information used in the embodiment shown in FIG. 3 has an 8-bit length. As shown, the address control circuit 42 has registers 61 and 62 for temporarily storing a start address and registers 63 and 64 for temporarily storing an end address. That is to say, the registers 61, 62, 63 and 64 temporarily store the start address or the end address transferred from the control section 31 through the data bus 43.

In this embodiment, the registers 61 to 64 are each constructed by 4 bits and may be a circuit chip identified by Model No. Ser. No. 74175 (Quad D flip-flop with clear) and produced by Texas Instruments Inc. The output signals from the start address registers 61 and 62 are applied to 4-bit counters 65 and 66, respectively. The counters 65 and 66 receive the output signal from an AND circuit 67 as a clock signal and increment the address value by 1 every time the clock signal is applied thereto. The timing pulse $TP_a$ ($TP_b$) and a Q output signal from the flip-flop circuit 68, to be described later, are applied to the AND circuit 67. When both the signals are logical '1', the AND circuit 67 is fully conditioned to apply the clock signal to the counters 65 and 66.

The address information outputted from the counters 65 and 66 is applied to the comparators 69 and 70. The end address information loaded in the end address registers 63 and 64 is also applied to the comparators 69 and 70. The comparators 69 and 70, which are comprised of exclusive OR circuits, for example, compare the address information incremented from the counters 65 and 66 with the end address information, respectively. When the compared fields are not coincident with each other, the comparators 69 and 70 produce signals of logical '1'. If the compared fields are coincident with each other, the signals produced are logical '0'. The signals outputted from the comparators 69 and 70 are inputted to a D-type flip-flop 68. To the D-type flip-flop 68 is inputted the timing pulse $TP_a$ ($TP_b$) as a clock signal through a delay line 71. In response to the clock signal, the D-type flip-flop 68 produces the latched information to the AND circuit 67. In the comparators 69 and 70, when the counted address value (current address) and the end value are coincident with each other, the comparators 69 and 70 produce signals of logical '0' which in turn are applied through the D-type flip-flop 68 to one of the input terminals of the AND gate 67. Subsequently, the AND circuit 67 applies a logical '0' to the counters 65 and 66, so that the address control circuit 42 ceases the operation.

Write Circuit (FIG. 5)

The write circuits 40 and 41 will be described with reference to FIG. 5. As shown, the write circuits 40 and 41 include two 4-bit counters 74 and 75. To those counters 74 and 75 is applied the address information from the control section 31 through the data bus 36 (37). At the timing of the address set pulse, the address information is loaded into the counters 74 and 75. A write pulse is supplied to the counters 74 and 75 and, at the timing of the write pulse, the counters 74 and 75 produce the counts as the write address information to the local memory 38 (39). In addition to the address set pulse, the main control section 31 produces a read/write signal, a memory select signal, and a write pulse signal. The write pulse is applied to the local memory 38 (39) through a delay line 76 and an inverter 77, as a write enable signal 82. After a write start address is set in the 4-bit counters 74 and 75 by the data bus 36 (37) and an address set pulse 78, the counters 74 and 75 operate in response to a write pulse 81 in synchronism with write data 83 to supply the write address to the local memory 38 (39). The read/write signal designates a read mode or a write mode of the local memory 38 (39). The memory select signal 80 selects a local memory to be used for data write from those memories.

LOCAL MEMORY (FIG. 6)

Explanation will be made in detail of the local memory 38 (39) taken in connection with FIG. 6.

In the figure, the local memory 38 (39) has a multiplexer 84 to which read address information and write address information are applied through data buses 44 and 40 (41). A circuit chip having Model No. Ser. No. 74157 and manufactured by Texas Instrument Inc., for example, may be used for the multiplexer 84. The read/write signal 79 is also applied to the multiplexer 84. In response to the read/write signal, the multiplexer 84 applies a read or write address to the memories 85 and 86, through a bus 87. The memory 85 or 86 may be a circuit chip identified by Model No. I2147 in manufacture by Intel Corp. The write enable signal 82 and the memory select signal 80 are applied through a NAND circuit 88 to the memories 85 and 86, respectively. Further, write data 83 is applied to the memories 85 and 86. In a read mode, data from the memories 85 and 86 are applied to the input pattern format control circuit 55 and the judgment circuit 56.

Figures 7, 8:
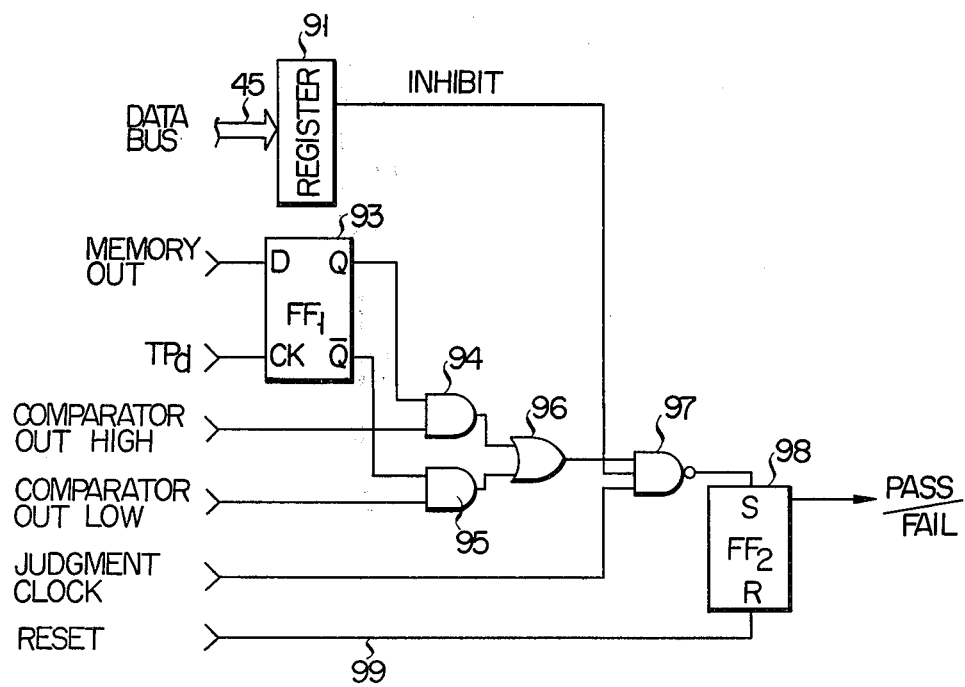
FIG. 7 shows a memory map of the local memory shown in FIG. 6.
FIG. 8 shows a circuit diagram of a GO/NO GO judgment circuit used in the circuit shown in FIG. 3.

A memory map of the local memory 38 or 39 is as shown in FIG. 7. The pins of the integrated circuit to be tested are numbered 1 to n. Those numbers are further specified with input (I) or output (O) pins, as shown. An address 0 stores a bit pattern (0,1,1 ... ) and an address 0' stores a bit pattern (0,0,0, ... ).

Judgment Circuit (FIG. 8)

The judgment circuit 56 will be described with reference to FIG. 8.

In the figure, the judgment circuit 56 has a register 91 to which judgment inhibit information from the control section 31 is applied through the data bus 45 (one bit of the related information passing through the data bus 45 is used for this inhibit information). The judgment circuit 56 corresponds to pin 1 of the integrated circuit 59. For example, if the integrated circuit 59 has sixty pins, sixty judgment circuits as shown in FIG. 8 are used. The judgment circuit 56 selects only the input test information and the expected value information transferred from the data multiplexer 50, and it does not react to the pin bearing the inhibit information. Output information from the data multiplexer 50 is latched in a D-type flip-flop 93. The D-type flip-flop 93 applies the output $\overline{Q}$ and the output Q to one of the input terminals of each of AND circuits 94 and 95 in synchronism with a timing pulse $TP_d$. Output signals with a HIGH level from the comparators $58_{a1}$ to $58_{an}$ shown in FIG. 3 are applied to the other input terminal of the AND circuit 94. The other input terminal of the AND circuit 95 are supplied with output signals with a LOW level from the comparators $58_{b1}$ to $58_{bn}$. The output signals from the AND circuits 94 and 95 are applied to the first input of the three inputs of a NAND circuit 97 through an OR circuit 96. The NAND circuit 97 receives at the second input terminal the output information from the register and at the third input terminal the clock signal for GO/NO GO judgment.

The bit pattern, '1' or '0' of the expected value information, is selected with either of a HIGH or a LOW level of the output signal from the comparator. When the result of the judgment is NO GO, the flip-flop 98 is set at the timing of the judgment clock. The output signal PASS/FAIL of the flip-flop 98 is transferred to the control section 31 and then a display section (not shown) displays 'GO' or 'NO GO'. The flip-flop 98 is reset by the reset signal 99.

Input Pattern Format Control Circuit (FIG. 9)

The input pattern format control circuit 55 will be described with reference to FIG. 9.

As shown, the input pattern format control circuit 55 includes a flip-flop 101 in which the output information from the data multiplexer 50, or the input test information, is latched at the timing of the timing pulse $TP_c$. The Q output of the flip-flop 101 is coupled with the input terminal of a second flip-flop circuit 102 and the output information of the multiplexer 103 is applied to the clock terminal of the flip-flop 102. The multiplexer 103, which has received various clock signals to time-shape the input test information, is so constructed as to select one of the measuring pins.

The selection of the input clock signal is made by a clock selection signal applied from a register 104 to the multiplexer 103. The various control information, for example, the information for designating the nonreturn-to-zero (NRZ) information or the return-to-zero (RZ) information, coming through the data bus 45 from the control section 31 is loaded into the register 104 via the data bus. The output information of the register 104 is inputted to one of the input terminals of an AND circuit 105 and to one of the input terminals of an AND circuit 107 by way of an inverter 106. The Q output of the flip-flop 102 is applied to the other input of the AND circuit 107. The Q output of the flip-flop 101 is applied through an AND circuit 108 to the other input of the AND circuit 105. The outputs of the AND circuits 107 and 105 are applied to the respective input of an OR circuit 109. The output signal from the OR circuit 109 is applied as a data drive signal to data registers $52_1$ to $52_n$.

The waveform of the output signal from the input pattern format control circuit 55 is illustrated in FIG. 10, for example. FIG. 10A shows a waveform of a signal inputted to the D-type flip-flop 101. The waveforms shown in FIGS. 10B and 10C are examples of various input clock signals applied to the multiplexer 103. FIG. 10D shows a waveform of an output signal from the OR circuit 109 when an input clock signal 1 is selected in the NRZ method. FIG. 10E shows a waveform obtained when the input clock signal 1 is selected in the RZ method. A waveform shown in FIG. 10F is obtained when an input clock signal 2 (CLOCK 2) is selected in the RZ method.

Operation

Figure 11:
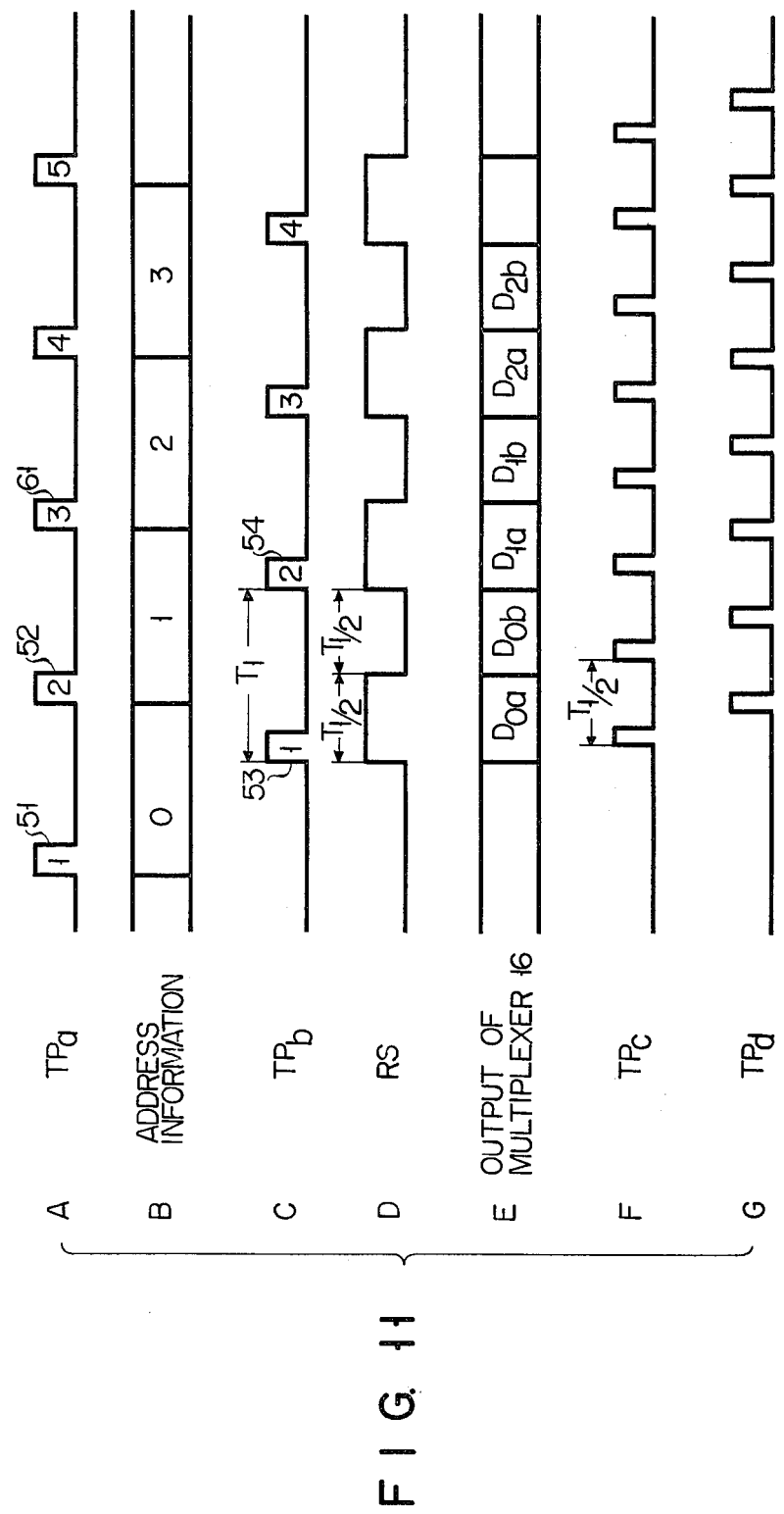
FIG. 11 shows a set of timing charts useful in explaining the operation of the embodiment shown in FIG. 3.

The operation of the function test evaluation apparatus thus constructed will be described with reference to FIG. 11.

First, the input test information and the expected value information previously stored in the main memory 33 are read out and are stored to the first and second local memories 38 and 39 under control of the first write circuit 34 and the second write circuit 35. Then, a timing pulse $TP_a$, which has a fixed period $T_1$, as shown in FIG. 11A, is successively applied to the address control circuit 42. After the 1st timing pulse $TP_a$ 51 is applied to the address control circuit 42, the circuit 42 produces address information to make an access to the respective 0th addresses of the first and second local memories 38 and 39, as shown in FIG. 11A. Upon receipt of the 1st timing pulse $TP_a$ 51, the address control circuit 42 produces the address information to specify the addresses 0 of the first and second local memories 38 and 39 and holds them therein until it receives the next timing pulse $TP_a$ 52. When receiving the address information, the first and second local memories 38 and 39 produce the information $D_{0a}$ and $D_{0b}$ stored in the addresses 0. The data registers 48 and 49 store the data read out from the memories 38 and 39, and hold them until the next timing pulse $TP_b$ 54 occurs. In the embodiment, the period of the timing pulse $TP_b$ is the same as that of the pulse $TP_a$ and is denoted as $T_1$.

When the timing pulse $TP_b$ is applied to the first and second data registers 48 and 49, the read-select signal RS rises in synchronism with the pulse $TP_b$ as shown in FIG. 11D, and continues at the high level state for $T_{1/2}$. During this period $T_{1/2}$, the data multiplexer 50 selects information from the data register 48 and supplies it as an output. After this period, the signal RS falls from a high level to a low level and continues at the low level state for the succeeding $T_{1/2}$ period. During this $T_{1/2}$ period, the data multiplexer 50 selects information from the data register 49 and supplies it as an output.

Accordingly, after receiving the first timing pulse $TP_b$, the data multiplexer 50 continuously produces the information in the addresses 0 of the local memories 48 and 49 within the period $T_1$, as shown in FIG. 11E. The input pattern format control circuit 55 time-shapes the input test information of those $D_{0a}$ and $D_{0b}$ in synchronism with the timing pulse $TP_c$ and applies the time-shaped one to the data drivers $57_1$ to $57_n$. The timing pulse $TP_c$ has the same period as $T_{1/2}$ when the multiplexer 50 produces the information. The data drivers $57_1$ to $57_n$ set each voltage level of the incoming information to a given voltage level, and then applies the information with the converted voltage level into the integrated circuit 59.

When the information stored in the addresses 0 of the memories 38 and 39 are loaded into the first and second data registers 48 and 49, the second timing pulse $TP_a$ is inputted to the address control circuit 42. In response to the second timing pulse $TP_a$, the address control circuit 42 produces the address information to specify address location 1 of each of the local memories 38 and 39. The address information is held until the next timing pulse $TP_a$ 61 is received, as shown in FIG. 11B. Upon receipt of the address information, the local memories 38 and 39 produce the data $D_{1a}$ and $D_{1b}$ stored in address location 0 of each memory 38 and 39. At the time point that the data $D_{1a}$ and $D_{1b}$ are read out, the second timing pulse $TP_b$ is not yet applied to the data registers 48 and 49. Accordingly, the data registers 48 and 49 still hold the data $D_{0a}$ and $D_{0b}$. After the data multiplexer 50 completes the output of the data $D_{0a}$ and $D_{0b}$ from the addresses 0, the second timing pulse $TP_b$ is applied to the multiplexer 50. Then the data registers 48 and 49 store the data $D_{1a}$ and $D_{1b}$ from the memories 38 and 39, respectively. The registers 48 and 49 hold the data $D_{1a}$ and $D_{1b}$ until the next timing pulse $TP_b$ is received.

When a second pulse $TP_b$ is applied to the data registers 48 and 49, the read-select signal RS rises to be high in level in synchronism with the pulse $TP_b$. During the period that the signal RS is high, the data multiplexer 50 selects the information $D_{1a}$ from the data register 48 and supplies it as an output. After the period of $T_{1/2}$, the signal RS falls from high to low in level.

During the succeeding period of $T_{1/2}$, the low level state is continued. During this low level state period, the data multiplexer 50 selects the data $D_{1b}$ from the data register 49 and supplies it as an output. After the application of the second timing pulse $TP_b$, the multiplexer 50 continuously produces the data $D_{1a}$ and $D_{1b}$ previously stored in the addresses 1 of the local memories 38 and 39 within the period $T_1$, as shown in FIG. 11.

Subsequently, in response to the succeeding timing pulses, the 2nd, 3rd, ..., the address control circuit 42 produces the address information to specify the addresses 2, 3, ..., while at the same time the data registers 48 and 49 store the data $D_{2a}$, $D_{2b}$, $D_{3a}$, $D_{3b}$, ... from the local memories 38 and 39. Following this, the multiplexer 50 succeedingly produces the data $D_{2a}$, $D_{2b}$, $D_{3a}$, and $D_{3b}$ in accordance with the level of the read-select signal RS, as shown in FIG. 11.

If the information from the multiplexer 50 is the input information, the information is applied through the data drivers $57_1$ to $57_n$ to the integrated circuit 59. When the information is the expected value information, the information is applied to the judgment circuit 56. Upon receipt of the input information, the integrated circuit 59 produces the response signal corresponding to the input information. The pair of the voltage comparators $58_{a1}$, $58_{b1}$ produce the information in the form of logical high or low signals. The pairs of voltage comparators $58_{a1}$, $58_{b1}$, ... $58_{an}$, $58_{bn}$, similarly produce the information in the form of logical high or low signals. When receiving the information from the comparators $58_{a1}$, $58_{b1}$, ... $58_{an}$, $58_{bn}$, and the timing pulse $TP_a$, the judgment circuit compares the information with the expected value information to evaluate the function of the integrated circuit 59, and to provide the result of the evaluation.

When the function test evaluation device thus constructed is used, the period $T_{1/2}$ that the test information is supplied from the circuit 55 to the integrated circuit 59 via the data drivers $57_1$ to $57_n$, that is to say, the test period, is 1/2 of the period $T_1$ of the timing pulse $TP_a$. Therefore, when the device of the invention with the same test period as that of the conventional one is used for the function test evaluation, the cycle times of the memories 38 and 39 are each about two times the conventional one. Generally, when there are memories with the same memory capacities, the memory with a longer cycle time is cheaper than that with a shorter one. Therefore, the memories with the longer cycle time and low price may be used for the local memories 38 and 39. Further, when the memories with the same cycle time as that of the conventional one are used for the local memories 38 and 39, the test period is half of the conventional one, as mentioned above, and the function test evaluation may be made within a short time period.

In the above-mentioned embodiment, two local memories are used; however, the number of the local memories is not limited to such. For example, if the number of the local memories is further increased, it is possible that, in accordance with the cycle time of the memory used, a cheaper local memory is used or the function of the integrated circuit is evaluated in an even shorter time period.

What is claimed is:

1. A function test evaluation apparatus for evaluating the functioning of an integrated logic circuit comprising:
    a control section including a main memory for storing input test information to be supplied to an integrated circuit to be tested and expected value information to be compared with real value information outputted from the integrated circuit after testing, a central processing element for performing various controls;
    a plurality of memory means for addressably storing the input test information supplied from said main memory of said control section and the expected value information and for outputting said input test information and said expected value information when addressed;
    a plurality of write circuit means for addressably writing the input test information and the expected value information outputted from said main memory into said plurality of memory means;
    an address control circuit means for simultaneously supplying the same address information through a plurality of said memory means;
    a plurality of data register means for storing said input test information and said expected value information outputted from said memory means when said memory means are addressed by said control circuit and for outputting said stored information in parallel;
    parallel-to-serial converting means for receiving said information outputted by said data register means and for converting said received information into serial data;
    a pattern format control circuit for receiving and shaping said serial data and supplying said shaped data to said integrated circuit to be tested; and
    judgment circuit means for comparing the expected value information outputted serially from said parallel-to-serial converting circuit with the information outputted from said integrated circuit after said integrated circuit has been supplied with said input test information.

* * * * *